United States Patent [19]

Dhindsa

[11] Patent Number: 5,740,016
[45] Date of Patent: Apr. 14, 1998

[54] SOLID STATE TEMPERATURE CONTROLLED SUBSTRATE HOLDER

[75] Inventor: Rajinder Dhindsa, Milpitas, Calif.

[73] Assignee: LAM Research Corporation, Fremont, Calif.

[21] Appl. No.: 623,713

[22] Filed: Mar. 29, 1996

[51] Int. Cl.$^6$ ............................................. H05K 7/20
[52] U.S. Cl. ........................... 361/704; 165/11.1; 34/92; 437/248
[58] Field of Search ............... 34/92; 165/1, 11.1, 165/80.1–80.5, 185; 118/69, 724, 728; 361/688, 699, 704, 707–711, 719, 720, 807, 809; 437/248

[56] References Cited

U.S. PATENT DOCUMENTS

| | | |
|---|---|---|
| 3,733,887 | 5/1973 | Stanley et al. |
| 4,119,403 | 10/1978 | Rex |
| 4,320,626 | 3/1982 | Donnelly |
| 4,402,185 | 9/1983 | Perchak |
| 4,491,173 | 1/1985 | Demand ............... 165/11.1 |
| 4,584,061 | 4/1986 | Shelton |
| 5,088,006 | 2/1992 | del Puerto et al. ........... 361/699 |
| 5,097,207 | 3/1992 | Blanz ........................ 324/58.1 |
| 5,115,858 | 5/1992 | Fitch et al. ..................... 165/1 |
| 5,177,878 | 1/1993 | Visser ........................... 34/92 |
| 5,203,401 | 4/1993 | Hamburgen et al. ......... 165/80.4 |
| 5,267,607 | 12/1993 | Wada ......................... 165/80.1 |
| 5,469,708 | 11/1995 | Harrison et al. |
| 5,491,452 | 2/1996 | Ohtsubo et al. |

*Primary Examiner*—Gregory D. Thompson
*Attorney, Agent, or Firm*—Burns, Doane, Swecker & Mathis, L.L.P.

[57] ABSTRACT

A substrate resting on a substrate surface is inserted into a processing chamber and processed to produce integrated chips. The substrate may be clamped electrostatically to the substrate support surface during processing. The substrate support surface plays a major role in controlling the temperature of the substrate during processing. The substrate support includes a plurality of thermoelectric modules in heat transfer contact with the substrate support surface and a controlled current supply. By controlling the current supply to each of these modules, the required temperature distribution can be maintained across the substrate support surface to maintain temperature uniformity across the substrate during processing. The thermoelectric modules control the temperature of the substrate support surface in response to controlled currents from the current supply to provide a uniform substrate temperature. The substrate support may be an RF biased electrode, and the substrate may be a semiconductor wafer. The current supply may contain filters matched to the desired RF frequency, and an RF decoupling plate may be provided between the electrode and the plurality of thermoelectric modules to electrically insulate the thermoelectric modules from the electrode. An additional thermal management system such as a heat sink may be in heat transfer contact with the thermoelectric modules, on for example the opposite side as the electrode for efficient and effective substrate temperature control with minimum use of power to the thermoelectric modules. The heat sink pulls heat away from the electrode and supplies heat to the electrode as needed. The heat sink may be water-cooled or air-cooled. Once processed, the substrate is removed from the processing chamber. The steps of inserting, processing, and removing may be repeated for a plurality of substrates.

43 Claims, 3 Drawing Sheets

5,740,016

SOLID STATE TEMPERATURE CONTROLLED SUBSTRATE HOLDER

FIELD OF THE INVENTION

The present invention relates to a temperature controlled substrate support and a method of processing a substrate. More particularly, the present invention relates to a solid state temperature controlled substrate support for maintaining a desired temperature distribution across a substrate during processing in semiconductor equipment and a method for processing the substrate to produce integrated chips.

BACKGROUND OF THE INVENTION

Fabrication of semiconductor devices or integrated chips is conventionally carried out by processing a substrate such as an Si, Ge or GaAs semiconductor wafer in semiconductor equipment. The wafer is typically processed through a series of semiconductor processes, such as lithography, chemical vapor deposition, plasma etching, and so on. The number of integrated chips, referred to as the yield, varies depending on the overall quality of the wafer and how the wafer is processed. One parameter that affects the yield is the surface temperature of the wafer during processing. The more uniform the surface temperature of the wafer, the higher the yield.

Wafer temperature is generally controlled by controlling the temperature of a substrate support, such as a platen, a chuck or an electrode, upon which the wafer rests and controlling the heat-transfer coefficient across the wafer/support surface interface during processing. The wafer is typically clamped to the substrate support surface.

Conventionally, the temperature of the wafer is controlled by circulating coolant, which is typically liquid, in a cooling groove inside the electrode. External chillers are typically used to control the coolant temperature. To improve the heat-transfer coefficient between the wafer and the electrode, a backside gas pressure of, for example, helium gas, is typically employed.

The external chillers, the cooling path, and the equipment for supplying helium gas make this conventional approach for controlling wafer surface temperatures expensive and complicated. Also, the response time for the temperature to change across the wafer during processing is very poor due to the number of thermal heat transfer interfaces required and the remote location of the chiller.

Another problem with the conventional approach arises from the temperature differences created across the wafer during semiconductor processing. The temperature uniformity on the wafer during processing depends upon a number of factors such as plasma uniformity, backside gas distribution at the wafer/electrode interface, temperature uniformity across the electrode surface, and so on. In most of the plasma aided semiconductor processes, wafer temperature tends to rise as the result of high energy ion bombardment. Thus, for example, if processing is concentrated at the center of the wafer, the center may become hotter than the edges of the wafer during processing.

In the conventional approach, because there is only one cooling groove and one liquid circulating within the cooling groove, it is not possible to control the temperature distribution across the wafer surface. In order to maintain part of the wafer surface at a suitable temperature during processing, other portions of the wafer become unsuitable for use in the production of integrated chips. Thus, it is impossible using the conventional approach to maintain a uniform optimal temperature across the entire wafer surface during processing.

In the past, because integrated chips were relatively large, only a small number of integrated chips could be produced from a wafer, leaving significant amounts of the wafer surface unused. For example, the edges of the wafer surface typically remained unused for chip production. Since only a small number of large chips could be produced from a wafer and large portions went unused, it was not critical to maintain temperature uniformity across the entire wafer surface.

As the trend of the semiconductor industry has been moving towards the fabrication of smaller integrated chips, it has become more important to provide uniform wafer surface temperature. For example, ultra large scale integration (ULSI) of semiconductor devices onto a single chip with a chip size below 0.25 micron requires good process control during all of the processes to provide a high yield of chips from a wafer. To obtain maximum yield for these small chips, it is important to maintain temperature uniformity across the entire surface of the wafer. As the sizes of semiconductor devices have gotten smaller and the substrate size has increased to reduce the fabrication costs per chip, controlling the wafer temperature has become an important challenge for the semiconductor processing industry.

Thus, there is a need for a simple, inexpensive solution for providing real time temperature control to maintain a uniform temperature across an entire substrate surface during semiconductor processing and thus provide a high yield of semiconductor devices.

SUMMARY OF THE INVENTION

According to the present invention, a temperature controlled substrate support is included in a semiconductor processing system for processing a substrate. A substrate resting on a substrate support surface is inserted into a processing chamber and processed to produce integrated chips. The substrate may be clamped electrostatically to the substrate support surface during processing. The substrate support surface plays a major role in controlling the temperature of the substrate during processing. The substrate support includes a plurality of thermoelectric modules in heat transfer contact with the substrate support surface and a controlled current supply. By controlling the current supply to each of these modules, the required temperature distribution can be maintained across the substrate support surface to provide temperature uniformity across the substrate during processing. The thermoelectric modules control the temperature of the substrate support surface in response to controlled currents from the current supply to provide a uniform substrate temperature. The substrate support surface may be an RF biased electrode, and the substrate may be a semiconductor wafer. The power supply may contain filters matched to the desired RF frequency, and an RF decoupling plate may be provided between the electrode and the plurality of thermoelectric modules to electrically insulate the thermoelectric modules from the electrode. An additional thermal management system such as a heat sink may be in heat transfer contact with the thermoelectric modules, on for example the opposite side as the electrode, to help control the substrate temperature while reducing the amount of power used, thus providing efficient and effective temperature control. The heat sink pulls heat away from the electrode and supplies heat to the electrode as needed. Once processed, the substrate is removed from the processing chamber. The steps of inserting, processing, and removing may be repeated for a plurality of substrates.

DETAILED DESCRIPTION OF THE PREFERRED EMBODIMENTS

Figure 1:
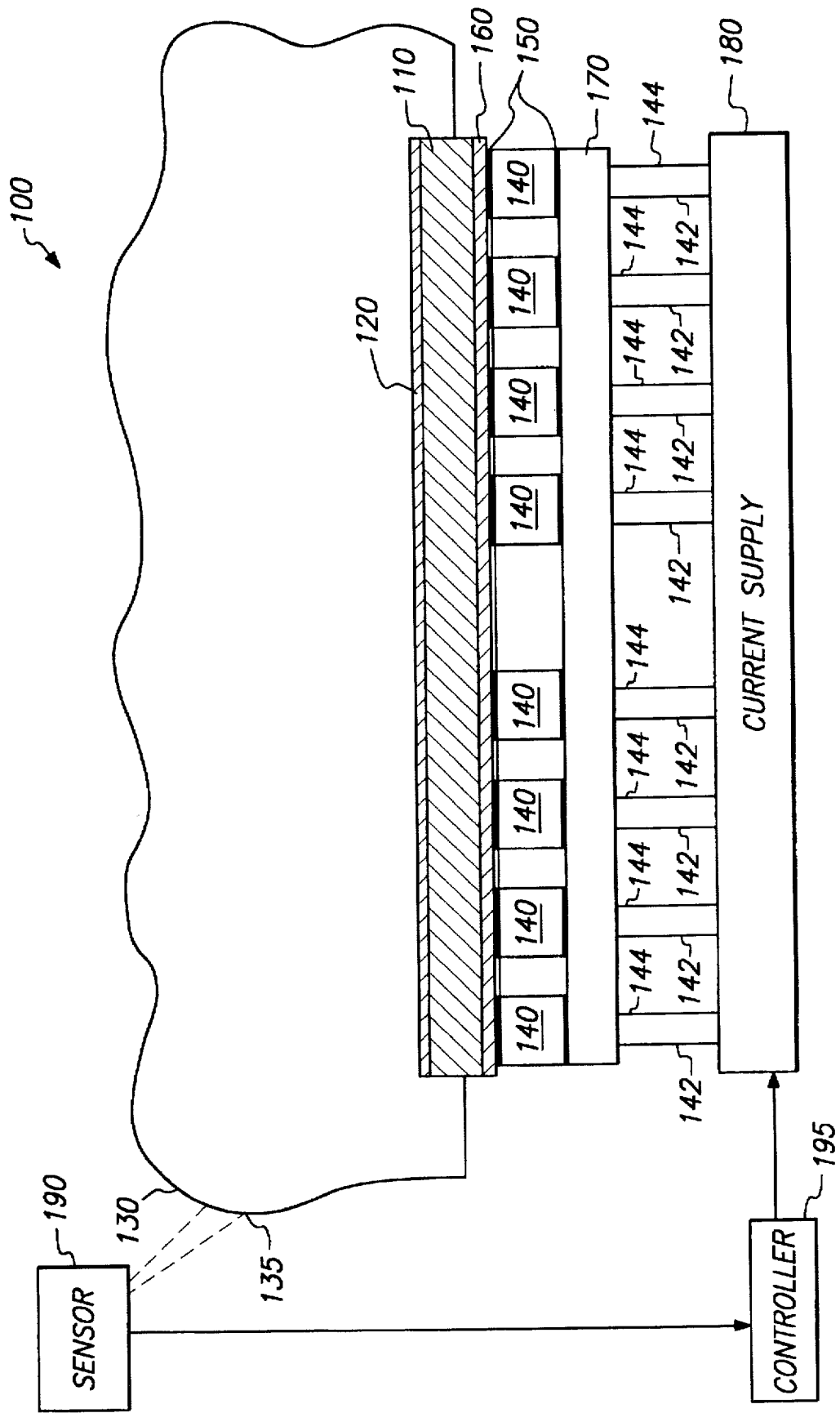
FIG. 1 illustrates a semiconductor processing system in which a solid state temperature controlled substrate support and a method of processing a substrate according to the present invention may be employed.

FIG. 1 illustrates a semiconductor processing system in which a temperature controlled substrate support and a method of processing a substrate according to the present invention may be employed. Referring to FIG. 1, a semiconductor processing system 100 for processing a substrate 120 comprises a substrate support and a processing chamber 130 enclosing the substrate support surface. The substrate 120 may be, for example, a semiconductor wafer or a flat panel display. The substrate support surface may comprise, for example, a chuck, a platen, or an electrode 110 as shown in FIG. 1. The substrate support may also comprise an interface to a radio frequency (RF) power source and a thermoelectric temperature control system. The wafer 120 may be clamped to the substrate support 110 either mechanically or by an electrostatic chucking structure fabricated or bonded to one side of the substrate support 110. Although not illustrated, the substrate support may also comprise a wafer handling system.

A wafer to be processed is inserted into the processing chamber 130. The processing chamber 130 provides the process environment, interfaces to wafer handling, gas delivery systems, etc. The process chamber may comprise, for example, a vacuum chamber. The wafer is typically processed in the processing chamber to produce integrated chips and then removed. A wafer handling system which is part of the overall wafer processing system is used to load and unload the wafer inside the process chamber. The steps of inserting, processing, and removing may be repeated for a plurality of wafers.

One side of the substrate support on which the substrate rests during the processing may comprise an electrostatic clamping structure. The other side of the substrate support may comprise a thermoelectric system for controlling the support surface temperature during processing, thereby controlling the substrate temperature during processing. The thermoelectric system comprises a plurality of thermoelectric modules 140. The thermoelectric modules may be assembled from conventional thermoelectric modules, such as those manufactured by Melcor or Thermodex Corporation. The thermoelectric modules are in heat transfer contact with a surface of the substrate support.

The thermoelectric modules 140 control the temperature of the electrode 110 in response to power supplied by a power supply through a power interface in the substrate support. For example, as shown in FIG. 1, controlled currents are supplied to the thermoelectric modules 140 by a current supply 180 through a current interface comprising lead lines 142 and 144. The thermoelectric modules 140 are secured to the electrode 110 with bonding material 150. The bonding material may be highly thermal conductive bonding material, such as epoxy.

The current supply 180 may be formed of any conventional power supply. The current supply may, for example, comprise a single current source, a number of individual current sources one for each thermoelectric module, or a number of currents sources one for each group of thermoelectric modules. The range of currents supplied by the current supply may be, for example, 0–20 amperes, depending on the heat load of the semiconductor processing system.

The solid state thermoelectric modules 140 control the temperature of the substrate support, thereby controlling the temperature of the wafer during processing. For example, by controlling the power to the thermoelectric modules, the required temperature distribution can be controlled across the substrate support surface in order to maintain temperature uniformity across the substrate during processing. Alternatively, any desired temperature distribution may be maintained across the substrate during processing.

It may be necessary to provide the substrate support with RF power to produce desired process results. In this case, the current supply 180 may include filters matched to the desired RF of the semiconductor processing system. Also, an RF decoupling plate 160 may be optionally inserted between the electrode and the plurality of thermoelectric modules to electrically insulate the thermoelectric modules while providing good thermal conduction to the electrode 110. The RF decoupling plate may be made of a thermally conductive ceramic material, such as BeO, AlN, and so on.

A controller 195 may be used to control the currents supplied by the current supply 180. The controller may control the currents based on a statistical data concerning the temperature distribution of a wafer. In this case, the controller controls the current supply to supply constant currents that are set in advance. Alternatively, the controller may control the currents in response to sensed temperature information obtained during the processing. The sensed temperature information may be obtained, from a sensor such as an infrared (IR) camera 190. The camera 190 senses the temperature across the wafer surface through a window 135 in the processing chamber. Based on the sensed temperature information, the controller 195 adjusts the currents supplied to the thermoelectric modules by the current supply, thus providing real time wafer temperature control.

The thermoelectric modules 140 control the temperature of the electrode in response to currents supplied by the current supply 180 to provide a desired temperature distribution across the surface of the wafer 120 during processing. To cool the electrode, the thermoelectric modules pull heat away from the electrode towards, for example, the surrounding environment. To heat the electrode, the thermoelectric modules pull heat towards the electrode from, for example, the surrounding environment.

The current supply may supply currents having the same value to all the thermoelectric modules. Alternatively, the currents supplied to individual thermoelectric modules or groups of thermoelectric modules may have different values, permitting dynamic temperature control of the wafer. For example, the current supplied to the thermoelectric modules arranged under the center of the electrode 110 may be different than the current applied to the thermoelectric modules arranged under the edges of the electrode 110, so that the wafer surface is heated or cooled by different amounts in the center and edges. This dynamic temperature control compensates for the difference in temperatures of the wafer surface at the center and the edges due to the semiconductor processing, so that a desired temperature distribution across the wafer surface may be maintained during processing.

To make the temperature control by the thermoelectric modules more efficient, an additional thermal control system may be provided, such as the heat sink 170. As shown in FIG. 1, the heat sink 170 may be disposed underneath the thermoelectric modules, on the opposite side as the electrode 110. The heat sink 170 may be air cooled or water cooled. While the heat sink does not play an active role in controlling the temperature of the electrode, it helps cut down on the power requirement to control the heat load on the other side of the thermoelectric system.

Referring to FIG. 1, the heat sink 170 is in heat transfer contact with the thermoelectric modules. The heat sink helps cool the electrode by pulling heat away from the electrode. The heat sink also helps heat the electrode by acting as a heat source, providing heat for the electrode. The heat sink may be formed of any conventional heat sink material such as aluminum. The heat sink may be secured to the thermoelectric modules with the bonding material 150. Alternatively, a different bonding material may be used.

Figure 2A:
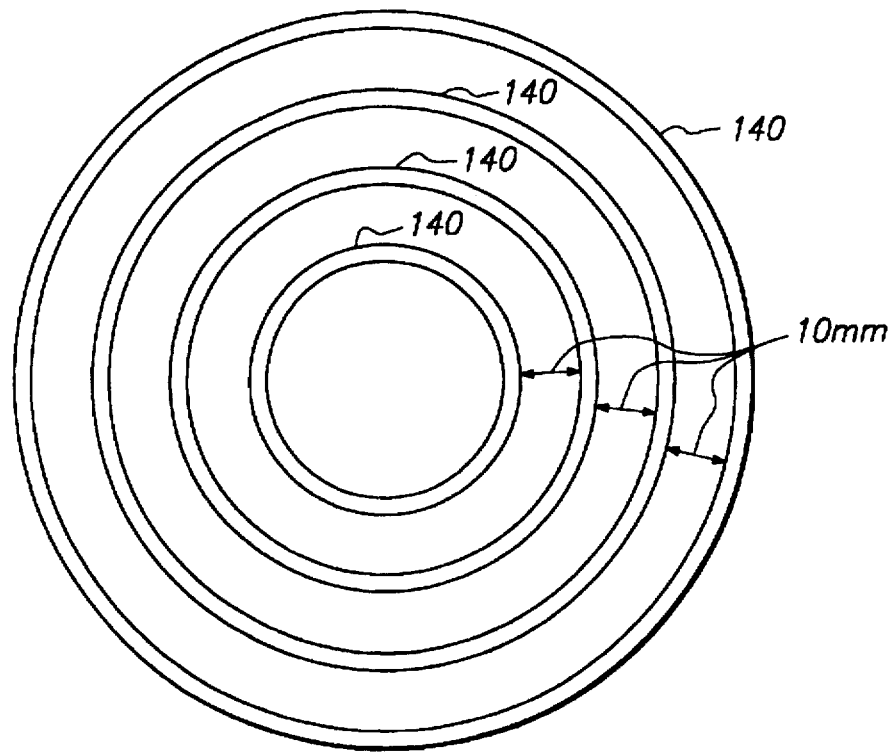
FIGS. 2a and 2b illustrate exemplary top views of thermoelectric module arrangements according to the present invention.
Figure 2B:
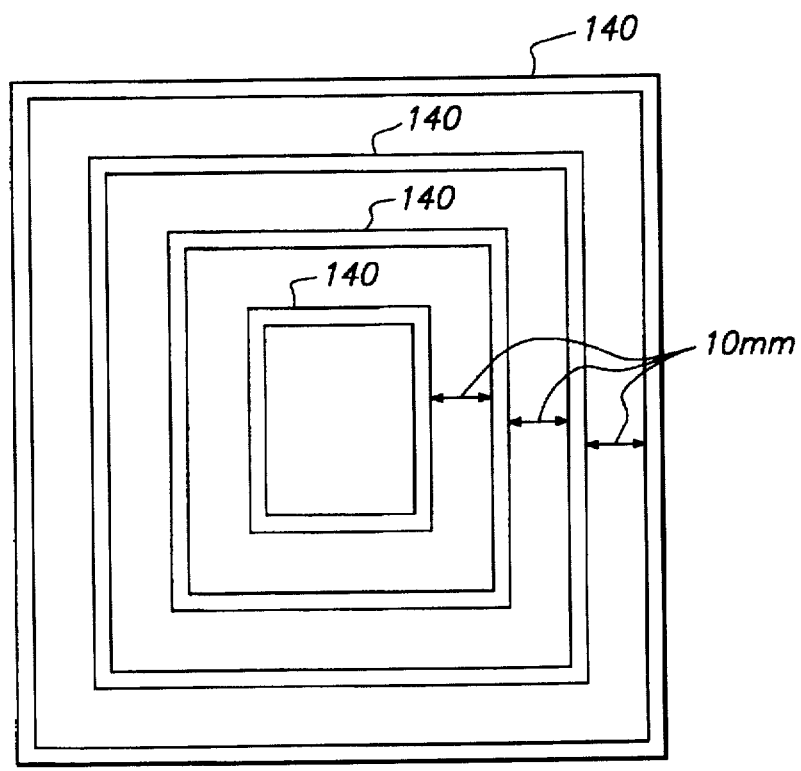

FIGS. 2a and 2b illustrate exemplary top views of thermoelectric module arrangements according to the present invention. As shown in FIG. 2a, the thermoelectric modules may be arranged in concentric circles. This arrangement may be used, for example, for controlling the temperature of a semiconductor wafer during processing. Alternatively, as shown in FIG. 2b, the thermoelectric modules may be arranged in repeating rectangles. This arrangement may be used, for example, for controlling the temperature of a flat panel display during processing. The spacing between the thermoelectric modules and the number of thermoelectric modules in the arrangements shown in FIGS. 2a and 2b depends on the degree of the need to control the temperature distribution across the substrate. For example, for processing a wafer from which a large number of small chips is desired, the wafer should have a highly uniform temperature. Thus, several closely spaced modules will have to be used. In contrast, for processing a wafer from which a smaller number of larger chips is desired, the wafer uniformity is not as critical, and fewer modules spread out farther apart may be used. The number of thermoelectric modules may, for example, be in the range of from 1 to 30, with the spacing between the thermoelectric modules being in the range of from 10 to 20 millimeters. Although FIGS. 2a and 2b depict exemplary arrangements, the thermoelectric modules may be arranged in any desired pattern.

Each thermoelectric module contains at least one thermoelectric device. The thermoelectric device may comprise two elements formed of different electroconductive material connected by a junction, operating according to the Peltier effect. Thus, when an electrical current passes through the junction of the two dissimilar conductors, it either cools or heats the junction depending on the direction of the current. A DC current flowing through the conductors causes the heat to transfer from one side to the other, creating a cold side and a hot side. By having an appropriate design of the substrate support using multiple thermoelectric modules at different locations on the substrate support, the temperature gradient across the substrate support surface can be controlled to be at a desired level in order to maintain a desired temperature distribution across the wafer during processing. Further, because the thermoelectric modules are mounted directly on the electrode, the response time for any temperature changes across the wafer surface will be much faster as compared to conventional cooling methods.

Figure 3:
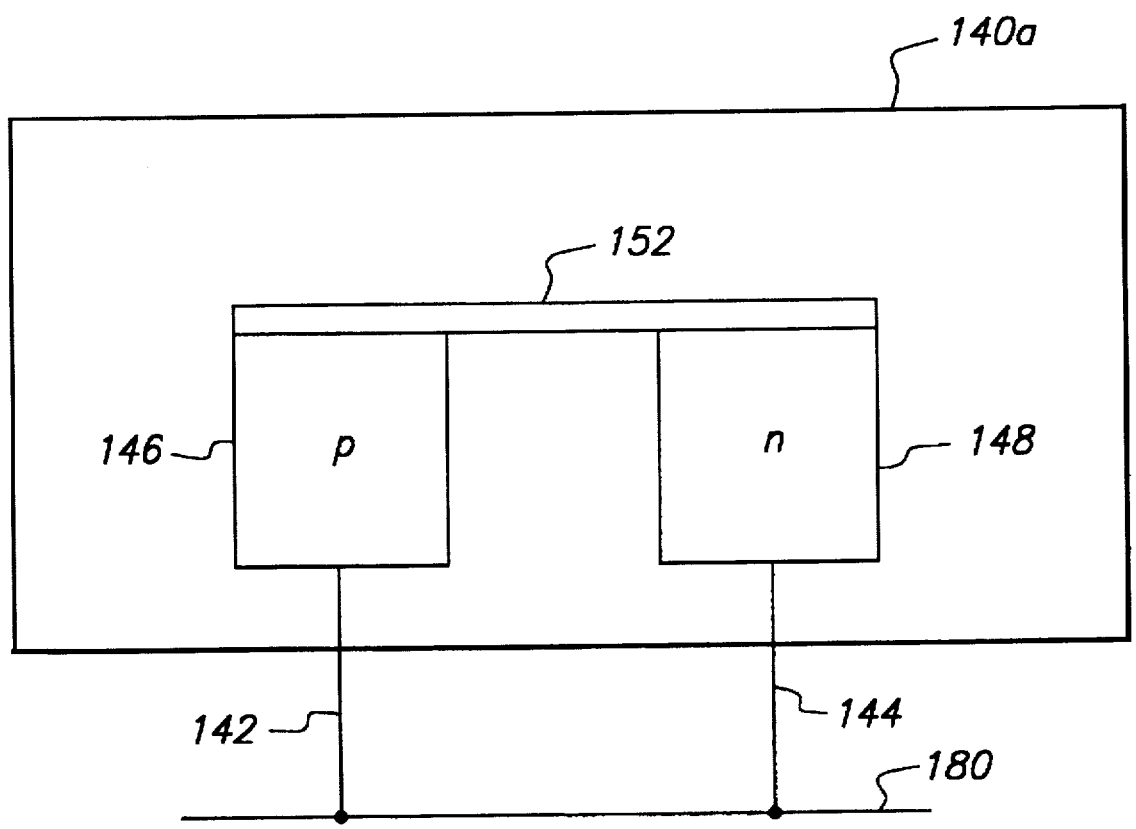
FIG. 3 illustrates in detail an exemplary thermoelectric device which may be employed in the temperature controlled substrate support according to the present invention.

FIG. 3 depicts an exemplary thermoelectric device according to the present invention. Referring to FIG. 3, a thermoelectric device 140a comprises a Peltier couple formed of a p-doped semiconductor element 146 and an n-doped semiconductor element 148, connected electrically in series and thermally in parallel by a connector 152. The connector 152 may be formed of thermally and electrically conductive material, such as copper.

Electrical currents supplied by the current supply 180 are passed through the lead lines 142 and 144 of the thermoelectric module 140, resulting in a variation of the temperature at the electrode 110.

To cool the electrode, current is supplied from the current supply 180 in a direction that causes heat to be pumped from the electrode towards the heat sink, causing the temperature of the electrode to decrease and causing the temperature of the heat sink to increase. For example, the current is passed through the thermoelectric module from the p-type semiconductor 146 to the n-type semiconductor 148, causing the heat to be pumped away from the electrode towards the heat sink, thereby cooling the electrode.

To heat the electrode, current is supplied from the current supply 180 in a direction that causes heat to be pumped to the electrode from the heat sink, causing the temperature of the electrode to increase and causing the temperature of the heat sink to decrease. For example, the current is passed through the thermoelectric module from the n-type semiconductor 148 to the p-type semiconductor 146, pulling heat towards the electrode from the heat sink, thereby heating the electrode.

In this manner, the localized temperature of the electrode in the vicinity of the thermoelectric module can be controlled, thereby permitting the temperature on the wafer surface to be kept uniform. Because electrons move quickly through the p and n semiconductors, the heating and cooling operations are rapidly performed, providing better temperature control than conventional methods.

It will be appreciated by those of ordinary skill in the art that the present invention can be embodied in other specific forms without departing from the spirit or essential characteristics thereof. The presently disclosed embodiments are therefore considered in all respects to be illustrative, and not restrictive. The scope of the invention is indicated by the appended claims, rather than the foregoing description, and all changes that come within the meaning and range of equivalence thereof are intended to be embraced therein.

What is claimed is:

1. In a semiconductor processing system for processing a substrate in a a vacuum processing chamber, a temperature controlled substrate support comprising:

a plurality of thermoelectric modules in heat transfer contact with a substrate support surface enclosed in the vacuum processing chamber; and a current supply interface, connected to said plurality of thermoelectric modules, for applying controlled currents to said thermoelectric modules to control the temperature of the substrate support surface and to provide a desired temperature distribution across the substrate during semiconductor processing of the substrate within said vacuum processing chamber.

2. The temperature controlled substrate support of claim 1, wherein the support surface comprises an electrostatic chuck.

3. The temperature controlled substrate support of claim 1, wherein the substrate support surface comprises an electrode, and the substrate comprises a wafer.

4. The temperature controlled substrate support of claim 3, wherein the electrode is radio frequency biased and the wafer is a semiconductor wafer.

5. The temperature controlled substrate support of claim 1, further comprising a radio frequency decoupling plate between the substrate support surface and the plurality of thermoelectric modules.

6. The temperature controlled substrate support of claim 1, further comprising a heat sink in heat transfer contact with the plurality of thermoelectric modules.

7. The temperature controlled substrate support of claim 6, wherein the heat sink is water cooled or air cooled.

8. The temperature controlled substrate support of claim 1, wherein the currents applied to said thermoelectric modules have different values.

9. The temperature controlled substrate support of claim 1, wherein the currents applied to said thermoelectric modules have the same value.

10. The temperature controlled substrate support of claim 1, wherein the thermoelectric modules are arranged in concentric circles.

11. The temperature controlled substrate support of claim 1, wherein the thermoelectric modules are arranged in repeating rectangles.

12. A method of processing a substrate in a semiconductor processing system comprising a temperature controlled substrate support and a vacuum processing chamber enclosing a substrate support surface, the method comprising the steps of:

supplying currents to a plurality of thermoelectric modules in heat transfer contact with the substrate support surface to control the temperatures of respective portions of the substrate support surface; and controlling the currents to control the temperature of the substrate support surface and to provide a desired temperature distribution across the substrate.

13. The method of claim 12, wherein the support surface comprises an electrostatic chuck.

14. The method of claim 12, wherein the substrate support surface comprises an electrode and the substrate comprises a wafer.

15. The method of claim 14, wherein the electrode is radio frequency biased, and the wafer is a semiconductor wafer.

16. The method of claim 12, wherein said plurality of thermoelectric modules are electrically insulated from the substrate support surface by a radio frequency decoupling plate.

17. The method of claim 12, wherein a heat sink in heat transfer contact with said plurality of thermoelectric modules pulls heat away from and supplies heat to said plurality of thermoelectric modules.

18. The method of claim 17, wherein said heat sink is water-cooled or air-cooled.

19. The method of claim 12, further comprising the steps of:

inserting said substrate into said vacuum processing chamber;

processing said substrate in said vacuum processing chamber; and removing said substrate from said vacuum processing chamber.

20. The method of claim 12, wherein said steps of inserting, processing, and removing are repeated for a plurality of substrates processed individually in the vacuum processing chamber.

21. The method of claim 12, wherein the currents applied to said thermoelectric modules have different values.

22. The method of claim 12, wherein the currents applied to said thermoelectric modules have the same value.

23. The method of claim 12, wherein the thermoelectric modules are arranged in concentric circles.

24. The method of claim 12, wherein the thermoelectric modules are arranged in repeating rectangles.

25. In a semiconductor processing system for processing a substrate in a processing chamber, a temperature controlled substrate support comprising:

a plurality of thermoelectric modules in heat transfer contact with a substrate support surface comprising an electrostatic chuck enclosed in the processing chamber; and a current supply interface, connected to said plurality of thermoelectric modules, for applying controlled currents to said thermoelectric modules to control the temperature of the substrate support surface and to provide a desired temperature distribution across the substrate during semiconductor processing of the substrate within said processing chamber.

26. The temperature controlled substrate support of claim 25, wherein the substrate support surface further comprises an electrode, and the substrate comprises a wafer.

27. The temperature controlled substrate support of claim 26, wherein the electrode is radio frequency biased and the wafer is a semiconductor wafer.

28. The temperature controlled substrate support surface of claim 25, further comprising a radio frequency decoupling plate between the substrate support surface and the plurality of thermoelectric modules.

29. In a semiconductor processing system for processing a substrate comprising a semiconductor wafer in a processing chamber, a temperature controlled substrate support comprising:

a plurality of thermoelectric modules in heat transfer contact with a substrate support surface comprising a radio frequency biased electrode enclosed in the processing chamber; and a current supply interface, connected to said plurality of thermoelectric modules, for applying controlled currents to said thermoelectric modules to control the temperature of the substrate support surface and to provide a desired temperature distribution across the substrate during semiconductor processing of the substrate within said processing chamber.

30. The temperature controlled substrate support of claim 29, wherein the substrate support surface further comprises an electrostatic chuck.

31. The temperature controlled substrate support of claim 29, further comprising a radio frequency decoupling plate between the substrate support surface and the plurality of thermoelectric modules.

32. A method of processing a substrate in a semiconductor processing system comprising a temperature controlled substrate support and a processing chamber enclosing a substrate support surface, the method comprising the steps of:

inserting said substrate into said processing chamber;

supplying currents to a plurality of thermoelectric modules in heat transfer contact with the substrate support surface to control the temperatures of respective portions of the substrate support surface;

controlling the currents to control the temperature of the substrate support surface and to provide a desired temperature distribution across the substrate;

processing said substrate in said processing chamber; and removing said substrate from said processing chamber.

33. The method of claim 32, wherein the support surface comprises an electrostatic chuck.

34. The method of claim 32, wherein the substrate support surface comprises an electrode and the substrate comprises a wafer, the processing comprising plasma etching or chemical vapor deposition.

35. The method of claim 34, wherein the electrode is radio frequency biased, and the wafer is a semiconductor wafer.

36. The method of claim 32, wherein said plurality of thermoelectric modules are electrically insulated from the substrate support surface by a radio frequency decoupling plate.

37. A method of processing a substrate in a semiconductor processing system comprising a temperature controlled substrate support and a processing chamber enclosing a substrate support surface comprising an electrostatic chuck, the method comprising the steps of:

supplying currents to a plurality of thermoelectric modules in heat transfer contact with the substrate support surface to control the temperatures of respective portions of the substrate support surface; and controlling the currents to control the temperature of the substrate support surface and to provide a desired temperature distribution across the substrate.

38. The method of claim 37, wherein the substrate support surface further comprises an electrode and the substrate comprises a wafer, the processing comprising plasma etching or chemical vapor deposition.

39. The method of claim 38, wherein the electrode is radio frequency biased, and the wafer is a semiconductor wafer.

40. The method of claim 37, wherein said plurality of thermoelectric modules are electrically insulated from the substrate support surface by a radio frequency decoupling plate.

41. A method of processing a substrate comprising a semiconductor wafer in a semiconductor processing system comprising a temperature controlled substrate support and a processing chamber enclosing a substrate support surface comprising a radio frequency biased electrode, the method comprising the steps of:

supplying currents to a plurality of thermoelectric modules in heat transfer contact with the substrate support surface to control the temperatures of respective portions of the substrate support surface; and controlling the currents to control the temperature of the substrate support surface and to provide a desired temperature distribution across the semiconductor wafer.

42. The method of claim 41, wherein the support surface further comprises an electrostatic chuck, the method further comprising processing the semiconductor wafer by plasma etching or chemical vapor deposition.

43. The method of claim 41, wherein said plurality of thermoelectric modules are electrically insulated from the substrate support surface by a radio frequency decoupling plate.

\* \* \* \* \*